United States Patent
Saito et al.

(10) Patent No.: US 6,177,229 B1
(45) Date of Patent: Jan. 23, 2001

(54) PHOTOSENSITIVE COMPOSITION

(75) Inventors: Satoshi Saito, Yamato; Naoko Kihara, Matsudo; Toru Ushirogouchi, Yokohama, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/237,659

(22) Filed: Jan. 27, 1999

(30) Foreign Application Priority Data

Jan. 30, 1998 (JP) .................................................. 10-018879

(51) Int. Cl.$^7$ ....................................................... G03C 1/73
(52) U.S. Cl. ..................... 430/270.1; 430/281.1; 430/905; 430/914
(58) Field of Search ............................. 430/270.1, 281.1, 430/905, 326, 914

(56) References Cited

U.S. PATENT DOCUMENTS 5,707,776 * 1/1998 Kawabe et al. ................... 430/270.1
5,814,432 * 9/1998 Kobayashi ........................... 430/312
6,010,826 * 1/2000 Abe et al. .......................... 430/285.1

FOREIGN PATENT DOCUMENTS 4-165359   6/1992   (JP) .

OTHER PUBLICATIONS

Aldrich Catalog (1996–1997) Published by Aldrich Chemical Company, Inc. p. 1500.*
Derwent Abstract (Access #1992–245935): English abstract of the Japanese Patent, JP 04165359A, Jun. 11, 1992.*

* cited by examiner

Primary Examiner—Janet Baxter
Assistant Examiner—Sin J. Lee
(74) Attorney, Agent, or Firm—Oblon, Spivak, McClelland, Maier & Neustadt, P.C.

(57) ABSTRACT

Disclosed is a positive photosensitive composition, comprising an alkali soluble resin having at least some or all of the alkali soluble groups protected by a substituent which can be decomposed by an acid, a compound which generates an acid upon irradiation with an actinic radiation, and a compound which generates water under action of an acid catalyst.

18 Claims, No Drawings

ND

PHOTOSENSITIVE COMPOSITION

BACKGROUND OF THE INVENTION

The present invention relates to a positive photosensitive composition which can be used as a photoresist in the manufacture of a semiconductor device and to a pattern forming method using the same.

Photoresist is used in the manufacture of electronic parts requiring various types of fine processing such as semiconductor integrated circuits like LSI. Also, a demagnificating projection type mask aligner, which is generally called stepper, is used as a light exposure apparatus for forming a resist pattern. The light source used in such a light exposure apparatus includes, for example, g-line (wavelength of 436 nm), h-line (wavelength of 405 nm), and i-line (wavelength of 365 nm) of a mercury lamp and an excimer laser light of KrF (wavelength of 248 nm), ArF (wavelength of 193 nm), $F_2$ (wavelength of 157 nm), etc. Also, the exposure using an electron beam and an ion beam is an important technology in that, since the beam has a short wavelength, it is possible to achieve a fine processing, and in that a pattern can be formed directly. Such being the situation, it is of high importance to develop a resist adapted for such an exposure technology.

Formation of a fine pattern with a high through-put is absolutely necessary in recent years in accordance with progress in the degree of integration of semiconductor integrated circuit such as LSI. An electron beam lithography technology of a high sensitivity is also absolutely necessary as well as the resist material and process technology adapted for the lithography technology. However, the electron beam lithography necessitates a vacuum system, giving rise to problems derived from the use of the vacuum system. For example, resist containing an alkali soluble resin having an acetal group introduced therein as a protective group has a small activation energy for the deblocking reaction and, thus, is advantageous in that the resist exhibits a high sensitivity. However, where a resist film formed by coating a substrate with such a resist is irradiated with an electron beam, a layer which is unlikely to be dissolved in a developing solution is formed on the surface of the resist film, resulting in failure to form a resist pattern having a strict dimensional accuracy. In the worst case, the layer unlikely to be dissolved in the developing solution extends to cover an upper surface of the adjacent resist pattern, making it impossible to achieve resolution of the pattern.

In the light exposure using a KrF excimer laser light which does not require a vacuum system, the resist is affected by the condition such as humidity in the light exposure step after the resist coating step, making it difficult to form a resist pattern of a predetermined size at a predetermined sensitivity.

BRIEF SUMMARY OF THE INVENTION

An object of the present invention, which has been achieved in view of the above-noted problems, is to provide a positive photosensitive composition which permits forming a resist pattern rectangular in cross section and having a predetermined dimensional accuracy at a high sensitivity in the exposure using an electron beam, and to a resist pattern forming method using the particular composition.

According to an aspect of the present invention, there is provided a positive photosensitive composition, comprising an alkali soluble resin having at least some or all of the alkali soluble groups protected by a substituent which can be decomposed by an acid, a compound which generates an acid upon irradiation with an actinic radiation, and a compound which generates water under action of an acid catalyst.

According to another aspect of the present invention, there is provided a positive photosensitive composition, comprising an alkali soluble resin having at least some or all of the alkali soluble groups protected by a substituent which can be decomposed by an acid and water, a compound which generates an acid upon irradiation with an actinic radiation, and a compound which generates water under catalytic action of the acid.

According to another aspect of the present invention, there is provided a positive photosensitive composition, comprising an alkali soluble resin having at least some or all of the alkali soluble groups protected by a substituent which can be decomposed by an acid, a compound which generates an acid upon irradiation with an actinic radiation, and a tertiary alcohol and/or a secondary alcohol.

According to still another aspect of the present invention, there is provided a resist pattern forming method, comprising the step of forming a photosensitive layer containing as a main component a positive photosensitive composition on a substrate, the step of light exposure for selectively irradiating a predetermined region of the photosensitive layer with an actinic radiation, the step of applying a heat treatment to the photosensitive layer after the light exposure, and developing the photosensitive layer after the light exposure to remove selectively the light-exposed portion of the photosensitive layer.

DETAILED DESCRIPTION OF THE INVENTION

The positive photosensitive composition of the present invention comprises an alkali soluble resin having a phenol skeleton and a weight average molecular weight of 1,000 to 50,000. The alkali soluble resin used in the present invention includes, for example, phenol novolak resin, xylenol novolak resin, vinyl phenol resin, cresol novolak resin, and copolymer between vinyl phenol and acrylic resin.

A substituent which can be decomposed by an acid is introduced into the alkali soluble resin for protection of some or all of the alkali soluble groups of the alkali soluble resin in order to control the dissolution rate in the developer. The particular substituent, which is hereinafter referred to as "dissolution inhibiting group", includes, for example, acetal group; tert-butyl derivative substituents such as tert-butoxy carbonyl group, tert-butoxy carbonyl methyl group, and tert-butoxy carbonyl ethyl group; alkyl silyl groups such as trimethyl silyl group, triethyl silyl group and triphenyl silyl group. These dissolution inhibiting groups can be used singly or in combination.

In the case of using an alkali soluble resin having the dissolution inhibiting group, particularly acetal group, introduced therein, the present invention produces the most prominent effect. It is possible for the only acetal group to protect the alkali soluble groups of the alkali soluble resin. Alternatively, some of the alkali soluble groups may be protected by a dissolution inhibiting group other than acetal group.

The acetal group introduced into the alkali soluble resin includes, for example, linear or branched acetal groups such as 1-ethoxyethyl group, 1-propoxyethyl group, 1-n-butoxyethyl group, 1-iso-butoxyethyl group, and 1-tert-butoxyethyl group; and cyclic acetal groups such as tetrahydrofuranyl group and tetrahydropyranyl group.

It is possible to use an alkali soluble resin having the alkali soluble group protected by an acetal group in combination with another alkali soluble resin having the alkali soluble group protected by another dissolution inhibiting group.

The photosensitive composition of the present invention also comprises a compound which generates an acid upon irradiation with an actinic radiation. The particular compound, which is hereinafter referred to as an acid generating agent, includes, for example, onium salt, sulfonyl compound, sulfonic acid ester, and an organic halogen compound. The term "actinic radiation" collectively denotes an energy radiation or substance radiation capable of imparting a chemical change to the photosensitive composition and includes, for example, ultraviolet light having a short wavelength, electron beam, and X-rays.

The onium salt used as an acid generating agent in the present invention includes, for example, diazonium salt, sulfonium salt and iodonium salt each containing $CF_3SO_3^-$, $p\text{-}CH_3PhSO_3^-$, etc. as a pairing anion. Particularly, it is desirable to use triallyl sulfonium salt or diallyl iodonium salt as an acid generating agent. These onium salts are known as acid generating agents having a good sensitivity to irradiation with an actinic radiation. The onium salt used in the present invention includes, for example, trifluoroacetate containing diphenyl iodonium, 4,4'-dibutylphenyl iodonium, triphenyl sulfonium, etc., trifluoromethane sulfonate, toluene sulfonic acid compound, etc. The specific compound of the onium salt includes, for example, diphenyl iodonium trifluoromethane sulfonate, di(para-tert-butyl) phenyl iodonium trifluoromethane sulfonate and triphenyl sulfonium trifluoromethane sulfonate.

The sulfonium compound disclosed in U.S. Pat. No. 5,348,838, which generates sulfonic acid upon irradiation with an actinic radiation, can be used in the present invention. The specific sulfonium compound used in the present invention includes, for example, phenyl sulfonyl acetonitrile, bisphenyl sulfonyl methane, and triphenyl sulfonyl methane.

The sulfonic acid ester compound used in the present invention includes, for example, nitrobenzyl paratoluene sulfonic acid.

Further, the organic halogen compound disclosed in, for example, U.S. Pat. No. 3,515,552 and U.S. Pat. No. 3,536,489, which forms a hydrogen halide, can be used in the present invention. The specific compound of the organic halogen compound used in the present invention includes, for example, 2,4,6-trichloromethyl triazine.

The mixing amount of the acid generating agent should be 0.1 to 20 parts by weight, preferably 0.2 to 10 parts by weight relative to the total weight of the solid components of the photosensitive composition. If the acid generating agent is mixed in an amount smaller than 0.1 part by weight, it is impossible to generate a sufficiently large amount of an acid. If the mixing amount exceeds 20 parts by weight, however, crosslinking of the resin (negative reaction) tends to take place.

The positive photosensitive composition of the present invention also comprises a compound which generates water in the presence of an acid catalyst. The particular compound, which is hereinafter referred to as a water generating agent, is not particularly limited in the present invention as far as a desired function can be produced by the compound. The water generating agent used in the present invention includes, for example, a tertiary alcohol compound represented by general formula (1) given below:

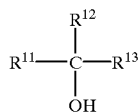

(1)

where $R^{11}$, $R^{12}$, $R^{13}$, which may be the same or different and may be bonded to each other to form a ring, individually represents a substituted or unsubstituted alkyl, alkenyl, alkoxy, aryl or acyl group.

It is also possible to use a tertiary alcohol compound represented by general formula (2) given below:

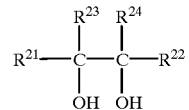

(2)

where $R^{21}$, $R^{22}$, $R^{23}$, $R^{24}$, which may be the same or different and may be bonded to each other to form a ring, individually represents a substituted or unsubstituted alkyl, alkenyl, alkoxy, aryl or acyl group.

The specific compounds which can be used as a water generating agent in the present invention include, for example, t-butanol, 2-methyl-2-butanol, 3-methyl-1,3-butanediol, 2,3-dimethyl-2-butanol, pinacol, 2-methyl-2-pentanol, 3-methyl-3-pentanol, 2,3-dimethyl-3-pentanol, 3-ethyl-3-pentanol, 2-methyl-2,4-pentane diol, 2,4-dimethyl-2,4-pentane diol, 2-methyl-2-hexanol, 3-methyl-3-hexanol, 1-methyl cyclohexanol, 2-methyl-2-heptanol, 2,5-dimethyl-2,5-hexane diol, 2,3-dimethyl-2-hexanol, 2,5-dimethyl-2-hexanol, 3,4-dimethyl-3-hexanol, 3,5-dimethyl-3-hexanol, 2-phenyl-2-propanol, 3-ethyl-2,2-dimethyl-3-pentanol, 2-methyl-1-phenyl-2-propanol, 2-phenyl-2-butanol, 1-adamantanol, menthane-3,8-diol, menthane(6)-2,8-diol, 3,7-dimethyl-3-octanol, 2-methyl-2-adamantanol, 3-methyl-2-phenyl-2,3-butane diol, 1,1-diphenyl ethanol, 1,2-diphenyl-2-propanol and benzopinacol.

It is also possible to use a tertiary alcohol compound represented by general formula (3) given below:

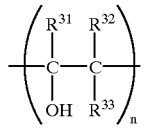

(3)

where $R^{31}$ represents a substituted or unsubstituted alkyl, alkenyl, alkoxy, aryl or acyl group, $R^{32}$ and $R^{33}$, which may be the same or different and may be bonded to each other to form a ring, individually represents a hydrogen atom, substituted or unsubstituted alkyl, alkenyl, alkoxy, aryl or acyl group, and n is an integer of at least 2.

The specific compound represented by general formula (3) includes, for example, an oligomer or polymer of α-methyl vinyl alcohol.

In addition to the tertiary alcohols exemplified above, it is also possible to use a secondary alcohol represented by general formula (4) given below as a water generating agent:

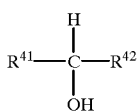

(4)

where $R^{41}$ and $R^{42}$, which may be the same or different and may be bonded to each other to form a ring, individually represents a substituted or unsubstituted alkyl, alkenyl, alkoxy, aryl or acyl group.

The specific compounds represented by general formula (4) include, for example, 2-propanol, 2-butanol, 2-methyl-3-butanol, 3-methyl-1,2-butane diol, 2-pentanol, 3-pentanol, 2-methyl-3-pentanol, 3-methyl-2-pentanol, 2,4-pentane diol, 2,3-hexanol, 2,4-hexanol, 2,5-hexanol, 2-adamantol, methyl-benzyl alcohol and hydrobenzoin.

It is also possible to use a secondary alcohol represented by general formula (5) given below as a water generating agent:

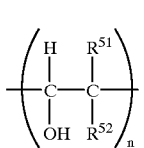

(5)

where $R^{51}$ and $R^{52}$, which may be the same or different and may be bonded to each other to form a ring, individually represents hydrogen atom, a substituted or unsubstituted alkyl, alkenyl, alkoxy, aryl or acyl group, and n is an integer of 2 or more.

The specific compound represented by general formula (5) includes, for example, an oligomer or polymer of vinyl alcohol.

The mixing amount of the water generating agent described above may be at least 0.1 times, preferably at least 0.2 times, as much in molar ratio as the mixing amount of the acid generating agent. Where the mixing amount of the water generating agent is less than 0.1 times as much as the mixing amount of the acid generating agent, it is difficult to obtain water generation in an amount sufficient for producing the effect of the present invention.

Where an oligomer or polymer of the tertiary alcohol or secondary alcohol represented by general formula (3) or (5) is used as the water generating agent, it is not absolutely necessary for the mixing amount of the water generating agent to be at least 0.1 times as much as the mixing amount of the acid generating agent. It should be noted that, with increase in the number n included in the general formula, the molecular weight of the oligomer or polymer is increased. Naturally, the number of hydroxyl groups included in the molecular structure is also increased with increase in the number n included in the general formula so as to enhance the water generation capacity of the compound. It follows that a desired effect can be obtained in some cases even if the mixing amount of the tertiary alcohol represented by general formula (3) or the secondary alcohol represented by general formula (5) is less than 0.1 times as much in molar ratio as the mixing amount of the acid generating agent.

The molecular weight of the compound represented by general formula (3) or (5) is not particularly limited as far as the compound is soluble in an ester-based solvent. It follows that n in general formula (3) or (5) can be determined appropriately in view of the solubility of the compound in a solvent.

The water generating agent should desirably have a relatively high boiling point, e.g., a boiling point of at least about 130° C. The compound which generates water under action of a catalyst may have a boiling point equal to or higher than that of pinacol. In forming a resist film, a resist solution coated on a substrate is subjected to a baking treatment at about 100° C. so as to evaporate the solvent. In order to prevent the water generating agent from being evaporated during the baking treatment, the water generating agent is required to have a relatively high boiling point.

The secondary alcohol and the tertiary alcohol aforementioned can be used singly or as a mixture of two or more alcohol. Also the secondary alcohol may be used combined with the tertiary alcohol.

The photosensitive composition of the present invention can be prepared by, for example, dissolving a resin component, an acid generating agent and a water generating agent in an organic solvent, followed by filtering the solution. The organic solvents used in the present invention include, for example, cyclohexanone, acetone, methyl ethyl ketone, methyl isobutyl ketone, methyl cellosolve, methyl cellosolve acetate, ethyl cellosolve acetate, butyl cellosolve acetate, methoxy methyl propionic acid, propylene glycol monomethyl ether acetate, ethyl lactate, ethyl acetate, butyl acetate, isoamyl acetate, γ-butyrolactone, dimethyl sulfoxide, dimethyl formamide and N-methyl pyrrolidone. These organic solvents can be used singly or in the form of a mixture of at least two of these organic solvents.

A surfactant acting as a coated film modifier, or as an environmental stabilizer such as an amine compound and a pyridine compound, etc. may also added to the positive photoresist composition of the present invention.

Let us describe a pattern formation covering the case where the photosensitive composition of the present invention is used as a resist. In the first step, a substrate is coated by a spin coating method or a dipping method with a solution prepared by dissolving the photosensitive composition of the present invention in the organic solvent described previously, followed by drying the coated film at 200° C. or less, preferably at 70 to 150° C., so as to form a resist film. The substrate used includes, for example, a silicon wafer, a silicon wafer having various insulating films, electrodes and wiring formed thereon, a compound semi-conductor wafer such as GaAs or AlGaAs wafer, a SiN mask, a CrO mask, and a MoSi mask.

In the next step, the resist film is selectively irradiated in a pattern with an actinic radiation, followed by baking the resist film at, for example, 200° C. or less by using an oven or a hot plate or by means of infrared ray irradiation.

After the baking step, the resist film is developed with a developing solution by means of a dipping method, a spraying method or a paddling method so as to remove selectively the portion irradiated with the actinic radiation from the resist film, thereby obtaining a desired resist pattern. The developing solution used in the present invention includes an aqueous solution of an organic alkaline compound such as tetramethyl ammonium hydroxide (TMAH) and an aqueous solution of an inorganic alkaline compound such as potassium hydroxide or sodium hydroxide. These alkaline aqueous solutions are generally used at a concentration of 15% by weight or less. It is possible to apply, as required, a rinsing treatment with, for example, water to the developed resist pattern.

The photosensitive composition of the present invention contains an alkali soluble resin having at least some or all of the alkali soluble groups protected by a dissolution inhibiting group and, thus, is insoluble in an alkaline aqueous solution before exposure to light. However, the acid generating agent, which is also contained in the composition, generates an acid when the composition is irradiated with an actinic radiation. The acid thus generated acts as a catalyst in the subsequent baking step so as to permit a water generating agent, which is also contained in the composition, to generate water and, at the same time, decomposes the dissolution inhibiting group protecting the alkali soluble group.

As a result of an extensive research on a resist containing an alkali soluble resin having an acetal group introduced therein as a dissolution inhibiting group, the present inventors have found that water is involved in the deblocking reaction of the acetal group. It has also been found that water is evaporated from the surface of the resist film, if the resist containing the particular alkali soluble resin is disposed in a vacuum system so as to cause the deblocking reaction to proceed at a different rate in a thickness direction of the resist film.

The positive photosensitive composition of the present invention contains a compound which generates water under the action of an acid catalyst. Therefore, the water evaporated under vacuum can be replenished so as to permit the deblocking reaction of the dissolution inhibiting group to proceed sufficiently. It follows that, in a resist film formed by coating the photosensitive composition of the present invention, the deblocking reaction of the dissolution inhibiting group proceeds uniformly and sufficiently over the entire thickness direction of the resist film from the film surface to substantially the substrate surface, making it possible to obtain a positive resist pattern having a good cross sectional shape of a high dimensional accuracy with a high resolution.

It is possible for the photosensitive composition of the present invention to contain an alkali soluble resin having a dissolution inhibiting group other than acetal group introduced therein. Even in this case, since the composition of the present invention contains a water generating agent, it is possible to obtain a resist having a sensitivity higher than that of a resist which does not contain a water generating agent. It should be noted in this connection that the length of acid diffusion during the baking treatment after the light exposure step is increased by the presence of water. It follows that mixing of a water generating agent as in the present invention permits improving the sensitivity so as to provide an electron beam resist of a high sensitivity regardless of the kind of the dissolution inhibiting group introduced into the alkali soluble resin.

Let us describe Examples of the present invention and Comparative Examples. Of course, the technical scope of the present invention is not limited by these Examples.

EXAMPLE 1

A resist solution was prepared by dissolving 100 parts by weight of an alkali soluble resin (A), which was polyhydroxystyrene having a weight average molecular weight of 20,000 and having 30% of the hydroxyl groups thereof protected by ethoxy ethyl groups, 1 part by weight of an acid generating agent (P1), which was triphenyl sulfonium triflate, and 8 parts by weight of 2-phenyl-2-propanol as a water generating agent in methoxy methyl propionic acid.

Then, a silicon wafer was coated by a spin coating method with the resist solution, followed by baking the coated film at 110° C. for 90 seconds so as to form a resist film 0.5 $\mu$m thick. The resist film was selectively exposed in a pattern to an electron beam by using an electron beam exposure apparatus and, then, baked at 90° C. for 3 minutes, followed by a developing treatment with an aqueous solution of tetramethyl ammonium hydroxide (TMAH) for 60 seconds so as to form a resist pattern.

Comparative Example 1

A resist pattern was formed as in Example 1, except that 2-phenyl-2-propanol acting as a water generating agent was not contained in the resist solution.

EXAMPLE 2

A resist pattern was formed as in Example 1, except that 10 parts by weight of pinacol was used as a water generating agent in place of 2-phenyl-2-propanol.

Comparative Example 2

A resist pattern was formed as in Example 2, except that pinacol acting as a water generating agent was not contained in the resist solution.

EXAMPLE 3

A resist pattern was formed as in Example 1, except that 5 parts by weight of benzopinacol was used as a water generating agent in place of 2-phenyl-2-propanol.

Comparative Example 3

A resist pattern was formed as in Example 3, except that benzopinacol acting as a water generating agent was not contained in the resist solution.

EXAMPLE 4

A resist pattern was formed as in Example 2, except that 1 part by weight of an acid generating agent (P2), i.e., diphenyl iodonium triflate, was used in place of the acid generating agent (P1), i.e., triphenyl sulfonium triflate.

Comparative Example 4

A resist pattern was formed as in Example 4, except that pinacol acting as a water generating agent was not contained in the resist solution.

EXAMPLE 5

A resist pattern was formed as in Example 1, except that 100 parts by weight of resin (B), which was polyhydroxystyrene having a weight average molecular weight of 20,000 and having 30% of the hydroxyl groups thereof protected by propoxy ethyl groups, was used in place of resin (A).

Comparative Example 5

A resist pattern was formed as in Example 5, except that 2-phenyl-2-propanol acting as a water generating agent was not contained in the resist solution.

EXAMPLE 6

A resist pattern was formed as in Example 5, except that 10 parts by weight of pinacol was used as a water generating agent in place of 2-phenyl-2-propanol.

Comparative Example 6

A resist pattern was formed as in Example 6, except that pinacol acting as a water generating agent was not contained in the resist solution.

EXAMPLE 7

A resist pattern was formed as in Example 5, except that 1 part by weight of the acid generating agent (P2) was used in place the acid generating agent (P1), and 5 parts by weight of benzopinacol was used as a water generating agent in place of 2-phenyl-2-propanol.

Comparative Example 7

A resist pattern was formed as in Example 7, except that benzopinacol acting as a water generating agent was not contained in the resist solution.

EXAMPLE 8

A resist solution was prepared by dissolving 100 parts by weight of resin (C), which was polyhydroxystyrene having a weight average molecular weight of 20,000 and having 20% of the hydroxyl groups thereof protected by tert-butoxy carbonyl methyl group, 1 part by weight of triphenyl sulfonium triflate acting as an acid generating agent, and 10 parts by weight of benzopinacol acting as a water generating agent, in methoxy methyl propionic acid.

Then, a silicon wafer was coated by a spin coating method with the resist solution, followed by baking the coated film at 110° C. for 90 seconds so as to form a resist film 0.5 $\mu$m thick. The resist film was selectively exposed in a pattern to an electron beam by using an electron beam exposure apparatus and, then, baked at 90° C. for 3 minutes, followed by a developing treatment with 0.26N of an aqueous solution of TMAH for 60 seconds so as to form a resist pattern.

Comparative Example 8

A resist pattern was formed as in Example 8, except that benzopinacol acting as a water generating agent was not contained in the resist solution.

EXAMPLE 9

A resist pattern was formed as in Example 1, except that poly-α-methyl vinyl alcohol having a weight average molecular weight of 5,000 was used as a water generating agent in place of 2-phenyl-2-propanol.

Comparative Example 9

A resist pattern was formed as in Example 9, except that poly-α-methyl vinyl alcohol acting as a water generating agent was not contained in the resist solution.

EXAMPLE 10

A resist pattern was formed as in Example 1, except that polyvinyl alcohol having a weight average molecular weight of 10,000 was used as a water generating agent in place of 2-phenyl-2-propanol.

Comparative Example 10

A resist pattern was formed as in Example 10, except that polyvinyl alcohol acting as a water generating agent was not contained in the resist solution.

EXAMPLE 11

A resist solution was prepared by dissolving 100 parts by weight of resin (D), which was polyhydroxystyrene having a weight average molecular weight of 18,000 and having 30% of the hydroxyl groups thereof protected by ethoxyethyl group, 1 part by weight of triphenyl sulfonium triflate acting as an acid generating agent, and 10 parts by weight of 2,4-dimethyl-2,4-pentandiol acting as a water generating agent, in methoxy methyl propionic acid.

Then, a silicon wafer was coated by a spin coating method with the resist solution, followed by baking the coated film at 110° C. for 90 seconds so as to form a resist film 0.5 $\mu$m thick. The resist film was selectively exposed in a pattern to an electron beam by using an electron beam exposure apparatus and, then, baked at 90° C. for 3 minutes, followed by a developing treatment with 0.21N of an aqueous solution of TMAH for 60 seconds so as to form a resist pattern.

Comparative Example 11

A resist pattern was formed as in Example 11, except that 2,4-dimethyl-2,4-pentandiol acting as a water generating agent was not contained in the resist solution.

The cross sectional shape of each of the resist patterns obtained in Examples 1 to 11 and Comparative Examples 1 to 11 was observed with a scanning electron microscope. Tables 1 and 2 show the results together with the electron beam sensitivity.

TABLE 1

| | electron beam sensitivity ($\mu C/cm^2$) | pattern shape |
|---|---|---|
| Example 1 | 6 | 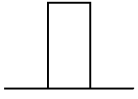 |
| Example 2 | 6 | 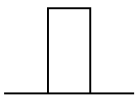 |
| Example 3 | 6 | 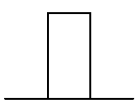 |
| Example 4 | 5 | 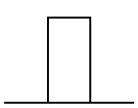 |
| Example 5 | 6.5 | 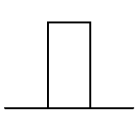 |
| Example 6 | 6.5 | 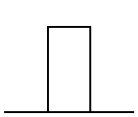 |
| Example 7 | 6 | 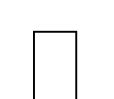 |
| Example 8 | 9 | 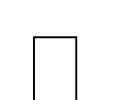 |

TABLE 1-continued

| | electron beam sensitivity ($\mu C/cm^2$) | pattern shape |
|---|---|---|
| Example 9 | 6.5 | 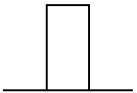 |
| Example 10 | 7 | 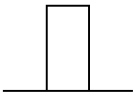 |
| Example 11 | 5 | 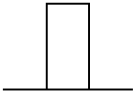 |

TABLE 2

| | electron beam sensitivity ($\mu C/cm^2$) | pattern shape |
|---|---|---|
| Comparative Example 1 | 8 |  |
| Comparative Example 2 | 8 |  |
| Comparative Example 3 | 8 |  |
| Comparative Example 4 | 8 | 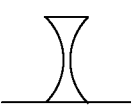 |
| Comparative Example 5 | 10 | 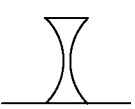 |
| Comparative Example 6 | 10 | 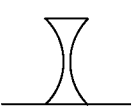 |
| Comparative Example 7 | 10 |  |
| Comparative Example 8 | 12 | 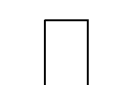 |

TABLE 2-continued

| | electron beam sensitivity ($\mu C/cm^2$) | pattern shape |
|---|---|---|
| Comparative Example 9 | 8 | 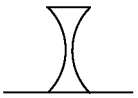 |
| Comparative Example 10 | 8 | 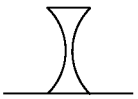 |
| Comparative Example 11 | 8 | 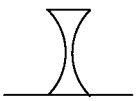 |

As apparent from Table 1, a resist pattern having a rectangular cross section was formed with a dose of electron beam of 6.5 $\mu C/cm^2$ or less in almost all the cases of using the photosensitive compositions of the present invention (Examples 1 to 11) containing a water generating agent. On the other hand, the upper portions of adjacent resist patters were found to be contiguous in almost all the cases of using the photosensitive compositions of the Comparative Examples, which did not contain a water generating agent, resulting in failure to achieve resolution of the pattern, as seen from Table 2. In Comparative Example 8, a pattern resolution was achieved by increasing the dose of electron beam to 12 $\mu C/cm^2$. In the other Comparative Examples, however, it was found impossible to form a resist pattern of a good cross sectional shape even if the dose of electron beam was increased.

As described above, the present invention provides a positive photosensitive composition which permits forming a resist pattern having a rectangular cross sectional shape at a high dimensional accuracy and at a high sensitivity, and also provides a pattern forming method using the particular positive photosensitive composition. Naturally, the composition and method of the present invention can be employed for fine processing in the manufacture of a semiconductor device and, thus, are of high industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A positive photosensitive composition, comprising an alkali soluble resin having at least some or all of the alkali soluble groups protected by a substituent which can be decomposed by an acid, a compound which generates an acid upon irradiation with an actinic radiation, and a compound which generates water under action of an acid catalyst and having a boiling point equal to or higher than that of pinacol.

2. The positive photosensitive composition according to claim 1, wherein said substituent which can be decomposed by an acid includes acetal group.

3. The positive photosensitive composition according to claim 1, wherein said compound which generates an acid upon irradiation with an actinic radiation is mixed in an amount of 0.1 to 20 parts by weight relative to the total weight of the solid components of the positive photosensitive composition.

4. The positive photosensitive composition according to claim 1, wherein said compound which generates water under action of said acid catalyst is a tertiary alcohol.

5. The positive photosensitive composition according to claim 4, wherein said tertiary alcohol is represented by general formula (1):

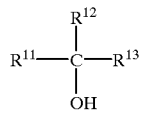

(1)

where $R^{11}$, $R^{12}$, $R^{13}$, which may be the same or different and may be bonded to each other to form a ring, individually represents a substituted or unsubstituted alkyl, alkenyl, alkoxy, aryl or acyl group, or by general formula (2):

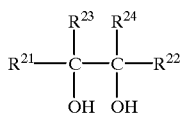

(2)

where $R^{21}$, $R^{22}$, $R^{23}$, $R^{24}$, which may be the same or different and may be bonded to each other to form a ring, individually represents a substituted or unsubstituted alkyl, alkenyl, alkoxy, aryl or acyl group.

6. The positive photosensitive composition according to claim 5, wherein said tertiary alcohol is mixed in an amount at least 0.1 times as much in molar ratio as the amount of said compound which generates an acid upon irradiation with an actinic radiation.

7. The positive photosensitive composition according to claim 6, wherein said tertiary alcohol is mixed in an amount at least 0.2 times as much in molar ratio as the amount of said compound which generates an acid upon irradiation with an actinic radiation.

8. The positive photosensitive composition according to claim 4, wherein said tertiary alcohol is represented by general formula (3):

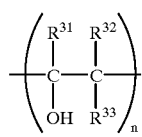

(3)

where $R^{31}$ represents a substituted or unsubstituted alkyl, alkenyl, alkoxy, aryl or acyl group, $R^{32}$ and $R^{33}$, which may be the same or different and may be bonded to each other to form a ring, individually represents a hydrogen atom, substituted or unsubstituted alkyl, alkenyl, alkoxy, aryl or acyl group, and n is an integer of at least 2.

9. The positive photosensitive composition according to claim 1, wherein said compound which generates water under the action of an acid catalyst is a secondary alcohol.

10. The positive photosensitive composition according to claim 9, wherein said secondary alcohol is represented by general formula (4):

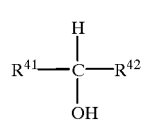

(4)

where $R^{41}$ and $R^{42}$, which may be the same or different and may be bonded to each other to form a ring, individually represents a substituted or unsubstituted alkyl, alkenyl, alkoxy, aryl or acyl group, or represented by general formula (5):

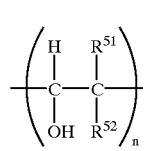

(5)

where $R^{51}$ and $R^{52}$, which may be the same or different and may be bonded to each other to form a ring, individually represents hydrogen atom, a substituted or unsubstituted alkyl, alkenyl, alkoxy, aryl or acyl group, and n is an integer of 2 or more.

11. The positive photosensitive composition according to claim 2, wherein said compound which generates an acid upon irradiation with an actinic radiation is mixed in an amount of 0.1 to 20 parts by weight relative to the total weight of the solid components of the positive photosensitive composition.

12. The positive photosensitive composition according to claim 11, wherein said compound which generates an acid upon irradiation with an actinic radiation is mixed in an amount of 0.2 to 10 parts by weight relative to the total weight of the solid components of the positive photosensitive composition.

13. The positive photosensitive composition according to claim 2, wherein said compound which generates water under action of an acid catalyst is a tertiary alcohol.

14. The positive photosensitive composition according to claim 13, wherein said tertiary alcohol is represented by general formula (1):

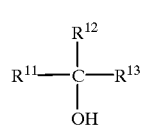

(1)

where $P^{11}$, $R^{12}$, $R^{13}$, which may be the same or different and may be bonded to each other to form a ring, individually represents a substituted or unsubstituted alkyl, alkenyl, alkoxy, aryl or acyl group, or by general formula (2):

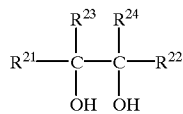
(2)

where $R^{21}$, $R^{22}$, $R^{23}$, $R^{24}$, which may be the same or different and may be bonded to each other to form a ring, individually represents a substituted or unsubstituted alkyl, alkenyl, alkoxy, aryl or acyl group.

15. The positive photosensitive composition according to claim 14, wherein said tertiary alcohol is mixed in an amount at least 0.1 times as much in molar ratio as the amount of said compound which generates an acid upon irradiation with an actinic radiation.

16. The positive photosensitive composition according to claim 13, wherein said tertiary alcohol is represented by general formula (3):

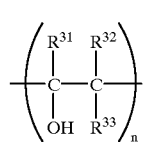
(3)

where $R^{31}$ represents a substituted or unsubstituted alkyl, alkenyl, alkoxy, aryl or acyl group, $R^{32}$ and $R^{33}$, which may be the same or different and may be bonded to each other to form a ring, individually represents a hydrogen atom, substituted or unsubstituted alkyl, alkenyl, alkoxy, aryl or acyl group, and n is an integer of at least 2.

17. The positive photosensitive composition according to claim 2, wherein said compound which generates water under action of an acid catalyst is a secondary alcohol.

18. The positive photosensitive composition according to claim 17, wherein said secondary alcohol is represented by general formula (4):

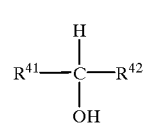
(4)

where $R^{41}$ and $R^{42}$, which may be the same or different and may be bonded to each other to form a ring, individually represents a substituted or unsubstituted alkyl, alkenyl, alkoxy, aryl or acyl group, or by general formula (5):

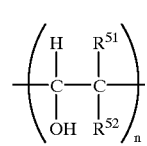
(5)

where $R^{51}$ and $R^{52}$, which may be the same or different and may be bonded to each other to form a ring, individually represents hydrogen atom, a substituted or unsubstituted alkyl, alkenyl, alkoxy, aryl or acyl group, and n is an integer of 2 or more.

* * * * *